US006275175B1

(12) United States Patent
Kahlman et al.

(10) Patent No.: US 6,275,175 B1
(45) Date of Patent: Aug. 14, 2001

(54) DEVICE FOR ENCODING/DECODING N-BIT SOURCE WORDS INTO CORRESPONDING M-BIT CHANNEL WORDS, AND VICE VERSA

(75) Inventors: Josephus A. H. M. Kahlman, Eindhoven (NL); Toshiyuki Nakagawa, Tokyo (JP); Yoshihide Shimpuku, Tokyo (JP); Tatsuya Narahara, Tokyo (JP); Kousuke Nakamura, Tokyo (JP)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/702,914

(22) Filed: Oct. 27, 2000

Related U.S. Application Data (63) Continuation of application No. 09/217,427, filed on Dec. 21, 1998, now Pat. No. 6,175,318.

(30) Foreign Application Priority Data

Dec. 22, 1997 (EP) .................................................. 97204050
Feb. 10, 1998 (EP) .................................................. 98200402

(51) Int. Cl.$^7$ ..................................................... H03M 7/00
(52) U.S. Cl. .............................................. 341/59; 341/50
(58) Field of Search .................................. 341/59, 50, 58, 341/63; 360/29, 48

(56) References Cited

U.S. PATENT DOCUMENTS 5,477,222   12/1995   Kahlman et al. ........................ 341/95
5,552,940 *  9/1996   Umemoto et al. .................. 360/19.1
5,861,825 *  1/1999   Ino ......................................... 341/50
6,175,318 *  1/2001   Kahlman et al. ....................... 341/59

OTHER PUBLICATIONS

L.J. Greenstein, "Spectrum of a Binary Signal Block Coded for DC Suppression", The Bell System Technical Journal, Jul.–Aug. 1974, pp. 1103–1106.

* cited by examiner

Primary Examiner—Pegut JeanPierre
(74) Attorney, Agent, or Firm—Michael E. Belk

(57) ABSTRACT

A device is disclosed for encoding a stream of databits of a binary source signal (S) into a stream of databits of a binary channel signal (C), wherein the bitstream of the source signal is divided into n-bit source words ($x_1$, $x_2$), which device comprises converting means (CM) adapted to convert said source words into corresponding m-bit channel words ($y_1$, $y_2$, $y_3$). The converting means (CM) are further adapted to convert n-bit source words into corresponding m-bit channel words, such that the conversion for each n-bit source word is parity preserving (table I) (FIG. 1). The relations hold that $m > n \geq 1$, $p \geq 1$, and that p can vary. Preferably, $m = n + 1$.

The device is adapted to convert the 8-bit bit sequence '00010001' in the source signal into the 12-bit bitsequence '100010010010' and to convert the 8-bit bitsequence '10010001' into the 12-bit bitsequence '000010010010', in order to limit the repeated minimum transition runlength in the channel signal. Also other 8-bit sequences require a specific encoding into 12-bit bitsequences in order to limit the k-constraint of the channel signal to 7.

Further, a decoding device is disclosed for decoding the channel signal obtained by means of the encoding device.

1 Claim, 6 Drawing Sheets

DEVICE FOR ENCODING/DECODING N-BIT SOURCE WORDS INTO CORRESPONDING M-BIT CHANNEL WORDS, AND VICE VERSA

This application is a con of Ser. No. 09/217,427 filed Dec. 21, 1998 now U.S. Pat. No. 6,175,818.

The invention relates to a device for encoding a stream of databits of a binary source signal into a stream of databits of a binary channel signal, wherein the bitstream of the source signal is divided into n-bit source words, which device comprises converting means adapted to convert said source words into corresponding m-bit channel words, the converting means being adapted to convert a block of p consecutive n-bit source words into a corresponding block of p consecutive m-bit channel words, such that the conversion for each block of p consecutive n-bit source words is substantially parity preserving, where n, m and p are integers, $m>n \geq 1$, $p>1$, and where p can vary. The invention also relates to a recording device comprising the encoding device, for recording the channel signal on a record carrier, to the record carrier itself, to an encoding method, and to a device for decoding a stream of data bits of a binary channel signal obtained by means of the encoding device, so as to obtain a stream of databits of a binary source signal.

An encoding device mentioned in the foregoing is known from U.S. Pat. No. 5,477,222 (PHN 14448). The document discloses a device for encoding a stream of databits of a binary source signal into a stream of databits of a binary channel signal, satisfying a (1,8) runlength constraint. That means that, in a serial datastream of the channel signal at minimum one 'zero' and at maximum eight 'zeroes' are present between two consecutive 'ones' in the channel signal. It should be noted in this respect that normally an additional precoding step, such as a 1T preceding, is applied to the (1,8) constrained sequence, resulting in a runlength limited sequence with minimum runlength 2 and maximum runlength 9.

The known conversion is parity preserving. 'Parity preserving' means that the parity of the n-bit source words to be converted equal the parity (after modulo-2 addition) of the corresponding m-bit channel words in which they are converted. As a result, the n-to-m conversion device as claimed does not influence the polarity of the signal.

As the conversion is parity preserving, an efficient DC control can be applied, such as by inserting DC control bits in the datastream of the source words.

The invention has for its object to provide an improved device for encoding n-bit source words into corresponding m-bit channel words.

The device in accordance with the invention is characterized in that the converting means is adapted to convert the 8-bit bit sequence '00010001' in the bitstream of the binary source signal into the 12-bit bit sequence '100010010010' of the binary channel signal.

The device in accordance with the invention is also characterized by one of the claims 2, 5, 6, 7 or 8.

The invention is based on the recognition that, encoding in accordance with the known encoding device relatively long sequences comprising only the minimum transition runlength may occur, leading to a deterioration of the bit detection in a bitdetector in a receiver, following transmission and subsequent decoding of the channel signal in the receiver. In a channel signal satisfying a specific runlength constraint, such as (1,7) or (1,8), this means that relatively long sequences '. . . 0101010101 . . . ' occur, resulting in relatively long sequences '. . . 001100110011 . . . ' in the sequence after 1T precoding.

The devices in accordance with the invention restrict the lengths of those sequences, so that an improved bitdetection in a receiver can be realized.

The encoding device in accordance with the invention can be used in combination with a bit-adder unit in which one bit is added to codewords of a certain length of the source signal. The signal obtained can be applied to the encoding device of the present invention. The channel signal of the encoding device is applied to a 1T-precoder. The purpose of the bit-adder unit is to add a '0'- or a '1'-bit to the consecutive code words included in the input signal of the converter, so as to obtain a precoder output signal which is DC free, or includes a tracking pilot signal having a certain frequency. The precoder output signal is recorded on a record carrier. The adding of a '0'-bit in the input signal of the converter results in the polarity of the output signal of the 1T precoder remaining the same. The adding of a '1'-bit results in a polarity inversion in the output signal of the 1T precoder. The converter therefore influences the output signal of the 1T precoder such that the running digital sum value of the output signal of the 1T precoder can be controlled so as to have a desired pattern as a function of time.

The invention will be further described in the following figure description, in which.

Figure 1:
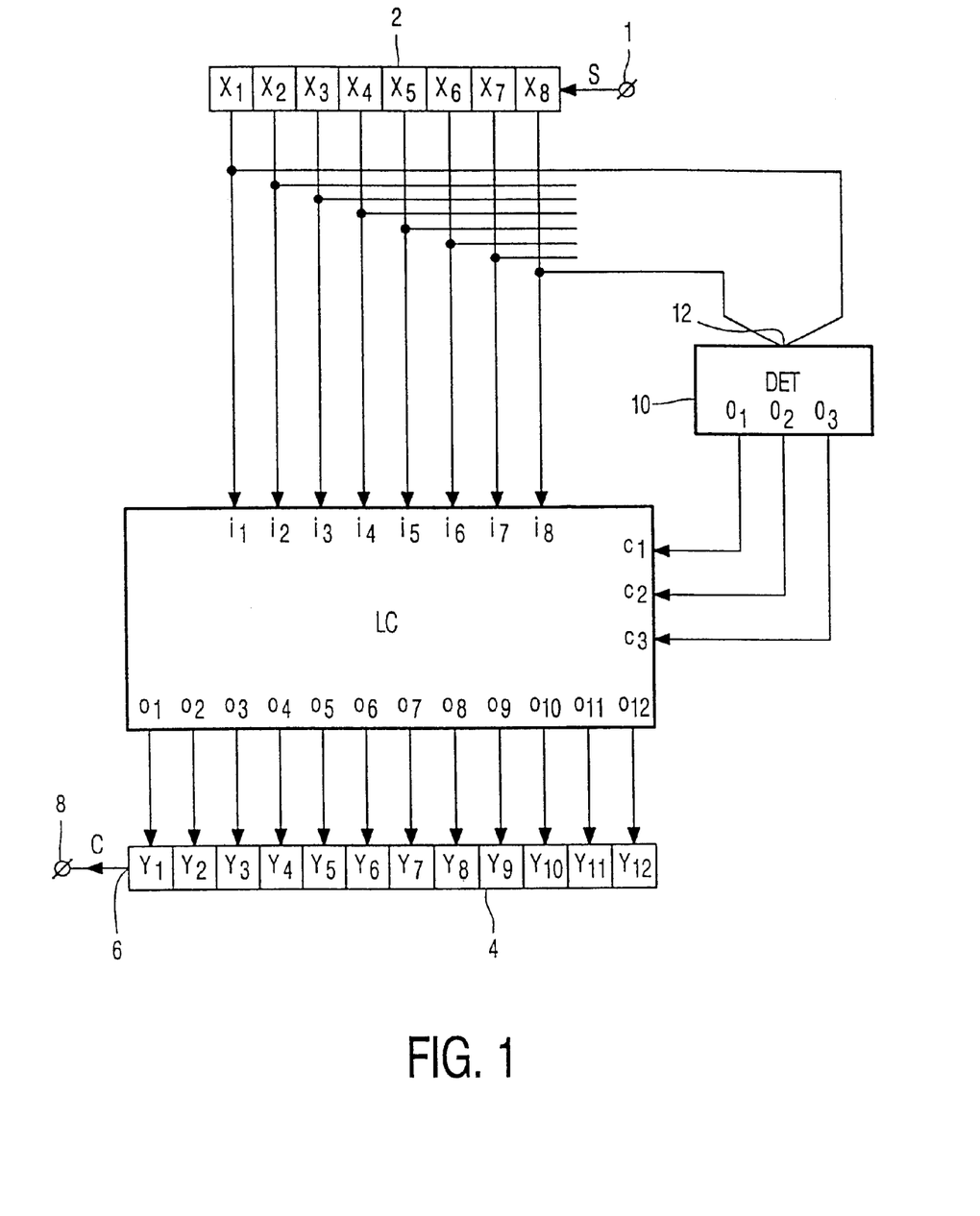
FIG. 1 shows a first embodiment of the encoding device.

FIG. 1 shows an encoding device that is capable of converting 2-bit source words into 3-bit channel words. The device described here is in fact the device also disclosed in U.S. Pat. No. 5,477,222, with further modifications to realize the objectives of a minimization of the repeated minimum transition runlength.

The device has an input terminal 1, for receiving a stream of databits of a inary source signal S. The terminal 1 is coupled to an input of a shift register 2 having eight cells $X_1$ to $X_8$, in the present example, so as to receive eight consecutive source bits of the source signal S. The shift register 2 functions as a serial-parallel converter. The outputs of the cells are coupled to corresponding inputs $i_1$ to $i_8$, respectively, of a logic circuit LC, for supplying the logic values $(x_1, \ldots, x_8)$ of the source bits present in the cells. The logic circuit LC forms part of the conversion means CM.

The device further includes a second shift register 4 having twelve cells $Y_1$ to $Y_{12}$. The logic circuit LC has twelve outputs $o_1$ to $o_{12}$. Those outputs of the logic circuit LC are coupled to corresponding inputs of the twelve cells $Y_1$ to $Y_{12}$, respectively, of the shift register 4. An output 6 of the shift register 4 is coupled to an output terminal 8. The shift register 4 functions as a parallel-serial converter, so as to obtain the binary channel signal C.

Further, a detector unit 10 is available for detecting specific sequences in the serial datastream of the source signal S. To that purpose, the outputs of the eight cells $X_1$ to $X_8$ of the shift register 2 are coupled to corresponding inputs, denoted 12, of the detector unit 10. In the present embodiment, the detector unit 10 has three outputs, denoted $o_1$, $o_2$ and $o_3$, for generating a first, second and third control signal, respectively. Those outputs are coupled to corresponding control signal inputs $c_1$, $c_2$ and $c_3$, respectively, of the logic circuit LC.

The functioning of the logic circuit LC in response to the control signals applied to its inputs $c_1$, $c_2$ and $c_3$, is as follows.

The logic circuit LC is capable of converting 2-bit source words SW into 3-bit channel words, such that the conversion for each 2-bit source word is parity preserving. That means that the number of 'ones' in the source word to be converted equals the number of 'ones' in the corresponding channel word, a modulo-2 addition on the 'ones' in the channel word being carried out. Or, otherwise said: if the number of 'ones' in the source word is even, the number of 'ones' in the channel word will be even. And: if the number of 'ones' in the source word is odd, the number of 'ones' in the channel word will be odd.

As an example, the converting means LC is adapted to convert the 2-bit source words SW into 3-bit channel words CW in accordance with the following table:

TABLE I

| source word ($x_1$, $x_2$) | | channel word ($y_1$, $y_2$, $y_3$) | |
|---|---|---|---|
| $SW_1$ | 00 | $CW_1$ | 101 |
| $SW_2$ | 01 | $CW_2$ | 100 |
| $SW_3$ | 10 | $CW_3$ | 001 |
| $SW_4$ | 11 | $CW_4$ | 000 |

It should be noted here, that the first bit in the source word is applied first to the shift register 2 and that the first bit in the channel word is supplied first from the output 6 of the shift register 4.

It should be further noted here, that the logic circuit LC converts 2-bit source words stored in the cells $X_1$,$X_2$ into 3-bit channel words and stores those channel words in the cells $Y_1$, $Y_2$, $Y_3$ of the shift register 4, in response to an absence of any control signal at the control signal inputs $c_1$, $c_2$ and $c_3$. Each conversion in this way, is followed by a shift over two positions to the left in the shift register 2, and a shift over three positions to the left in the shift register 4. The shift over two positions in the shift register 2 is required so as to make the shift register 2, and thus the converter, ready for a subsequent conversion. The shift over three positions in the shift register 4 is required in order to output the 3-bit channel word generated.

The device of FIG. 1 can be used to generate a channel signal C in the form of a (d,k) sequence satisfying the d=1 constraint. That means that at least one 'zero' is present between two subsequent 'ones' in the serial datastream of the channel signal. That is, that a concatenation of two or more 'ones' in the channel signal is prohibited.

It might occur that the unmodified conversion, such as by means of the device of FIG. 1, of combinations of two subsequent 2-bit source words might violate the d=1 constraint. Those combinations are the combinations; '00 00', which by unmodified conversion would lead to the two 3-bit channel words '101 101'; '00 01', which by unmodified conversion would lead to the two 3-bit channel words '101 100'; '10 00', which by unmodified conversion would lead to the two 3-bit channel words '001 101' and '10 01', which by unmodified conversion would lead to the two 3-bit channel words '001 100'.

The occurrence of such combinations should be detected so that a modified encoding of blocks of two 2-bit source words into blocks of two 3-bit channel words can take place. Therefore, the device of FIG. 1 is, in addition to the 'normal' encoding of 2-bit source words into 3-bit channel words, capable of detecting the above identified combinations, and is capable of realizing a modified encoding, such that the d=1 constraint in the channel signal is still satisfied.

Because of the fact that the outputs of the cells $X_1$ to $X_4$ of the shift register 2 are coupled to corresponding inputs of the detector unit 10, this detector unit 10 is capable of detecting the position in the serial bitstream of the source signal where unmodified encoding of single 2-bit source words in the bitstream into corresponding single 3-bit channel words would lead to a violation of the d=1 constraint in the channel signal C, and are adapted to supply a control signal at its output $o_1$ in response to such detection.

More specifically, the detector unit 10 detects whether the cells $X_1$ to $X_4$ comprise one of the 4-bit sequences that are given in table II, and generates a first control signal at its output $o_1$. As soon as the detector circuit 10 detects a combination of two 2-bit source words present in the four cell positions $x_1$,$x_2$,$x_3$,$x_4$, which combination equals one of the combinations given in the left hand column of table II, the logic circuit LC converts the combination in accordance with the modified coding as given in table II:

TABLE II

| source words | | unmodified coding | | modified coding | |
|---|---|---|---|---|---|
| 00 | 00 | 101 | 101 | 100 | 010 |
| 00 | 01 | 101 | 100 | 101 | 010 |
| 10 | 00 | 001 | 101 | 000 | 010 |
| 10 | 01 | 001 | 100 | 001 | 010 |

As can be seen from the table, unmodified conversion of the single two 2-bit source words leads to a violation of the d=1 constraint, as two 'ones' occur at the boundary between the two channel words obtained. The logic circuit LC is therefore adapted to convert in a modified coding mode, the blocks of two 2-bit source words given in the left column of the above table into the blocks of two 3-bit channel words as given in the right column in the above table II. As can be seen, no violation of the d=1 constraint occurs anymore. Moreover, the modified encoding in the same way is parity preserving. Further, one of the two 2-bit source words, which is in the above table the second one, is encoded into a 3-bit channel word which is unequal to one of the four channel words of table I. The reason for this is that on the receiver side, a detection of this 3-bit channel word not belonging to the set of four 3-bit channel words of the table I is possible, so that a corresponding decoding, which is the inverse of the encoding as defined with reference to table II, can be realized.

The block of two 3-bit channel words obtained by means of the encoding in conformity with table II, is supplied by the logic circuit LC to its outputs $o_1$ to $o_6$, which channel words are supplied to the six cells $Y_1$ to $Y_6$ of the shift register 4.

It will further be clear that, a conversion of two 2-bit source words into two 3-bit channel words by the converter unit LC, is followed by a shift over four positions to the left in the shift register 2 and a shift over six positions to the left in the shift register 4. The shift over four positions in the shift register 2 is required so as to make the shift register 2, and thus the converter, ready for a subsequent conversion. The shift over six positions in the shift register 4 is required in order to output the two 3-bit channel words generated.

The k-constraint in a (d,k) sequence means that a concatenation of at most k 'zeroes' between two subsequent 'ones' in the channel signal are allowed.

It might occur that the unmodified conversion of three subsequent 2-bit source words might violate the k-constraint.

As an example: the sequence of source words '11 11 11' would by unmodified conversion lead to the three 3-bit channel words '000 000 000'. If a (d,k) sequence should be obtained where k equals 6, 7 or 8, such combination of three 3-bit channel words should not occur.

Another example is the sequence of source words '11 11 10' which by unmodified conversion would lead to the three 3-bit channel words '000 000 001'. This combination of three 3-bit channel words does not satisfy a k=6 or k=7 constraint. Moreover, this combination of three 3-bit channel words can follow a previous channel word that ends with a '0', so that it might lead to a violation of a k=8 constraint. Further, the combination ends with a '1', so that it might lead to a violation of the d=1 constraint, if the combination is followed by a 3-bit channel word that starts with a '1'. An equivalent reasoning is valid for the sequence of source words '01 11 11'.

A further example is the sequence of source words '01 11 10' which by unmodified conversion would lead to the three 3-bit channel words '100 000 001'. This combination can, in the same way as given above, lead to a violation of the d=1 constraint.

The occurrence of such combinations should be detected so that a modified encoding can take place. Therefore, the device of FIG. 1 is, in addition to the 'normal' encoding of 2-bit source words into 3-bit channel words, as well as the modified encoding in accordance with table II, capable of detecting the above identified combinations, and is capable of realizing a modified encoding, such that the k-constraint in the channel signal is still satisfied.

Because of the fact that the outputs of the cells $X_1$ to $X_6$ of the shift register 2 are coupled to corresponding inputs of the detector unit 10, this detector unit 10 is capable of detecting the position in the serial bitstream of the source signal where unmodified encoding would lead to a violation of the k-constraint in the channel signal C, and are adapted to supply a control signal at its output $o_2$ in response to such detection.

More specifically, the detector unit 10 detects whether the cells $X_1$ to $X_6$ comprise one of the 6-bit sequences that are given in table III, and generates a second control signal at its output $o_2$.

As soon as the detector circuit 10 detects a combination of three 2-bit source words present in the six cell positions $x_1,x_2,x_3,x_4,x_5,x_6$, which combination equals one of the combinations given in the left hand column of table III, the logic circuit LC converts the combination in accordance with the modified coding as given in table III:

TABLE III

| source words | unmodified coding | modified coding |
|---|---|---|
| 11 11 11 | 000 000 000 | 000 010 010 |
| 11 11 10 | 000 000 001 | 001 010 010 |
| 01 11 10 | 100 000 001 | 101 010 010 |
| 01 11 11 | 100 000 000 | 100 010 010 |

The logic circuit LC converts in the second modification of the coding mode, the blocks of three 2-bit source words given in the left column of the above table III into the blocks of three 3-bit channel words as given in the right column in the above table. By realizing the modified encoding as per table III, a channel signal has been obtained which satisfies the k=8 constraint. Moreover, the modified encoding in the same way is parity preserving. This means in the present situation that, if the number of 'ones' in the combination of three 2-bit source words is odd (even), the number of 'ones' in the combination of the three 3-bit channel words obtained is odd (even). Further, two of the three 2-bit source words, which is in the above table the second one and the third one, is encoded into a 3-bit channel word which is unequal to one of the four channel words of table I. The reason for this is that on the receiver side, a detection of these two consecutive 3-bit channel words not belonging to the set of four 3-bit channel words of the table I is possible, so that a corresponding decoding, which is the inverse of the encoding as defined with reference to table III, can be realized.

The block of three 3-bit channel words obtained by means of the encoding in conformity with table III, is supplied by the logic circuit LC to its outputs $o_1$ to $o_9$, which channel words are supplied to the nine cells $Y_1$ to $Y_9$ of the shift register 4.

It will further be clear that, a conversion of three 2-bit source words into three 3-bit channel words by the converter unit LC, is followed by a shift over six positions to the left in the shift register 2 and a shift over nine positions to the left in the shift register 4. The shift over six positions in the shift register 2 is required so as to make the shift register 2, and thus the converter, ready for a subsequent conversion. The shift over nine positions in the shift register 4 is required in order to output the three 3-bit channel words generated.

A further requirement for encoding the source signal is that the repeated minimum transition runlength in the channel signal should be limited. The repeated minimum transition runlength is defined as the length of the sequence of subsequent transitions between '0' and '1', or: a sequence '. . . 01010101010 . . . ', in the case where the d-constraint equals 1. As an example, the bit sequence '00 01 00 01' results, after modified conversion using table II, in the bit sequence '101 010 101 010'. In the same way, the bit sequence '10 01 00 01' results, after modified conversion using table II, in the bit sequence '001 010 101 010'. Such sequences deteriorate the bit detection in a receiver. Restriction of the length of 01-sequences is thus required.

Because of the fact that the outputs of the cells $X_1$ to $X_8$ of the shift register 2 are coupled to corresponding inputs of the detector unit 10, this detector unit 10 is capable of detecting the position in the serial bitstream of the source signal where unmodified encoding would lead to a violation of the requirement that repeated minimum transition runlength is limited and is adapted to supply a control signal at its output $o_3$ in response to such detection.

More specifically, the detector unit 10 detects whether the cells $X_1$ to $X_8$ comprise one of the 8-bit sequences that are given in table IV, and generates a third control signal at its output $o_3$.

As soon as the detector circuit 10 detects a combination of four 2-bit source words present in the eight cell positions $x_1,x_2,x_3,x_4,x_5,x_6,x_7,x_8$, which combination equals one of the combinations given in the left hand column of table IV, the logic circuit LC converts the combination in accordance with the modified coding as given in table IV into a 12-bit bitsequence as given in the right column of this table IV.

TABLE IV

| 8-bit bitsequence in source signal | 12-bit bitsequence in channel signal |
|---|---|
| 00 01 00 01 | 100 010 010 010 |
| 10 01 00 01 | 000 010 010 010 |

The modified conversion as per table IV is again parity preserving.

It should be noted that the bitstream of the channel words is in NRZI (non-return to zero-inverse) notation, which means that a 'one' results in a transition in the write current for recording the channel signal on a magnetic record carrier.

Figure 2:
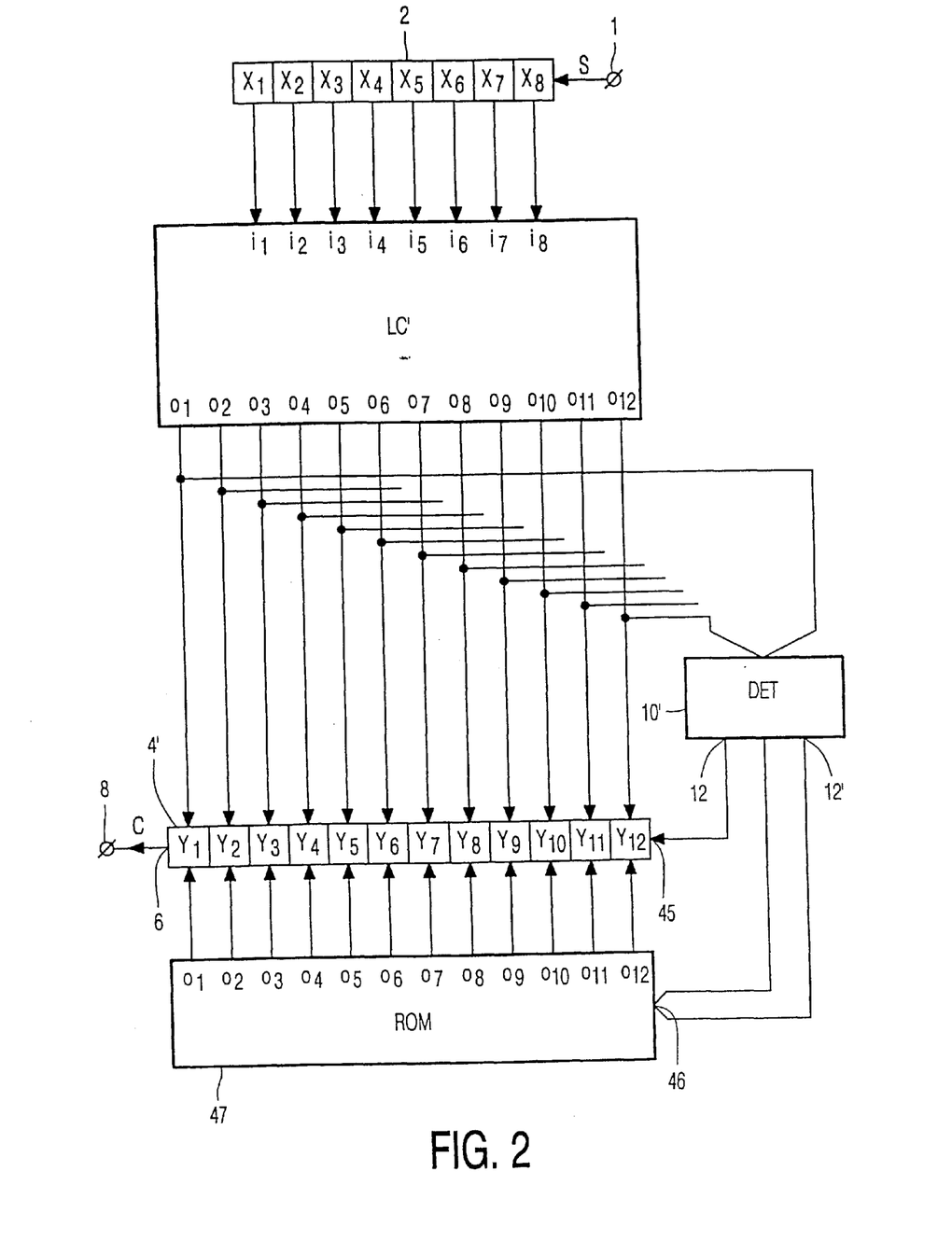
FIG. 2 shows a second embodiment of the encoding device.

In the foregoing, the situations where a modified encoding is required are detected by the detector unit 10 from the source words. It should however be noted that detection could be carried out on the channel words generated. Reference is made in this respect to FIG. 2b in U.S. Pat. No. 5,477,222.

FIG. 2 shows another embodiment of the encoding device in which detection of the situations where a modified encoding is required is done based on the channel words generated by an unmodified coding as per table I.

The device of FIG. 2 includes a detector 10' having 12 inputs for receiving the four subsequent 3-bit channel words obtained by means of an unmodified encoding as per table I in the circuit LC'. The detector 10' detects whether the two subsequent 3-bit channel words at the outputs $o_1$ to $o_6$ of the circuit LC', obtained using the unmodified coding, equal one of the four 6-bit sequences given in the middle column under 'unmodified coding' of table II. If so, the detector 10' issues a switching signal at its output 12 and an address signal AD at its output 12'. The switching signal is applied to a switching signal input 45 of the shift register 4'. The address signal AD is applied to an address signal input 46 of a ROM 47. The detector 10' generates one of four possible address signals AD1 to AD4, in response to the detection of a corresponding one of the four 6-bit sequences in the middle column of table II. As an example, the address signal AD1 is generated when the detector 10' detects the sequence '101101' and generates the address signal AD4 upon detection of the 6-bit sequence '001100'. The ROM 47 has the 6-bit sequences shown in the right column of table II stored. Upon the receipt of the address signal AD1, the ROM supplies the 6-bit sequence '100 010' at its outputs $o_1$ to $o_6$, and upon the receipt of the address signal AD2, the ROM supplies the 6-bit sequence '101 010' at those outputs. Upon the receipt of the address signal AD3, the ROM supplies the 6-bit sequence '000 010' at those outputs, and upon the receipt of the address signal AD4, the ROM supplies the 6-bit sequence '001 010' at those outputs. Each memory location of the shift register 4' has now two inputs, one of them being coupled with a corresponding output of the logic circuit LC', the other being coupled to a corresponding output of the ROM 47. In response to the switching signal applied to the input 45, the shift register accepts the information supplied to its lower inputs and shifts its contents over six positions to the left. As a result, a modified 6-bit sequence is supplied by the shift register 4' to the output 8.

The detector 10' also detects whether the three subsequent 3-bit channel words at the outputs $o_1$ to $o_9$ of the circuit LC', obtained using the unmodified coding, equal one of the four 9-bit sequences given in the middle column under 'unmodified coding' of table III. If so, the detector 10' issues a switching signal at its output 12 and an address signal AD at its output 12'. The detector 10' generates one of four possible address signals AD5 to AD8, in response to the detection of a corresponding one of the four 9-bit sequences in the middle column of table III. As an example, the address signal AD5 is generated when the detector 10' detects the sequence '000 000 000' and generates the address signal AD8 upon detection of the 9-bit sequence '100 000 000'. The ROM 47 has the 9-bit sequences shown in the right column of table III stored. Upon the receipt of the address signal AD5, the ROM supplies the 9-bit sequence '000 010 010' at its outputs $o_1$ to $o_9$, and upon the receipt of the address signal AD6, the ROM supplies the 9-bit sequence '001 010 010' at those outputs. Upon the receipt of the address signal AD7, the ROM supplies the 9-bit sequence '101 010 010' at those outputs, and upon the receipt of the address signal AD8, the ROM supplies the 9-bit sequence '100 010 010' at those outputs.

In response to the switching signal applied to the input 45, the shift register accepts the information supplied to its lower inputs and shifts its contents over nine positions to the left. As a result, a modified 9-bit sequence is supplied by the shift register 4' to the output 8.

The detector 10' further detects whether the four subsequent 3-bit channel words at the outputs $o_1$ to $o_{12}$ of the circuit LC', obtained using the unmodified coding, equal one of the following two 12-bit sequences: '101 010 101 010' or '001 010 101 010'. If so, the detector 10' issues a switching signal at its output 12 and an address signal AD at its output 12'. The detector 10' generates one of two possible address signals AD9 and AD10, respectively, in response to the detection of a corresponding one of the two 12-bit sequences given above. As an example, the address signal AD9 is generated when the detector 10' detects the sequence '101 010 101 010' and generates the address signal AD10 upon detection of the 12-bit sequence '001 010 010 101'. The ROM 47 has the 12-bit sequences shown in the right column of table IV stored. Upon the receipt of the address signal AD9, the ROM supplies the 12-bit sequence '100 010 010 010' at its outputs $o_1$ to $o_{12}$, and upon the receipt of the address signal AD10, the ROM supplies the 12-bit sequence '000 010 010 010' at those outputs.

In response to the switching signal applied to the input 45, the shift register accepts the information supplied to its lower inputs and shifts its contents over twelve positions to the left. As a result, a modified 12-bit sequence is supplied by the shift register 4' to the output 8.

In the normal situation, when none of the constraints is violated, unmodified conversion is carried out in accordance with table I, and the switching signal is absent so that the shift register accepts the bits supplied by the logic circuit LC' via the upper inputs of the shift register 4'.

It has been said previously that other conversion rules for converting single 2-bit source words into single 3-bit channel words are possible. Those conversion rules are given in the following three tables.

TABLE IV

| source word ($x_1$, $x_2$) | | channel word ($y_1$, $y_2$, $y_3$) | |
|---|---|---|---|
| $SW_1$ | 00 | $CW_1$ | 101 |
| $SW_2$ | 01 | $CW_2$ | 001 |
| $SW_3$ | 10 | $CW_3$ | 100 |
| $SW_4$ | 11 | $CW_4$ | 000 |

TABLE V

| source word ($x_1$, $x_2$) | | channel word ($y_1$, $y_2$, $y_3$) | |
|---|---|---|---|
| $SW_1$ | 00 | $CW_1$ | 000 |
| $SW_2$ | 01 | $CW_2$ | 100 |
| $SW_3$ | 10 | $CW_3$ | 001 |
| $SW_4$ | 11 | $CW_4$ | 101 |

TABLE VI

| source word ($x_1$, $x_2$) | | channel word ($y_1$, $y_2$, $y_3$) | |
|---|---|---|---|
| $SW_1$ | 00 | $CW_1$ | 000 |
| $SW_2$ | 01 | $CW_2$ | 001 |
| $SW_3$ | 10 | $CW_3$ | 100 |
| $SW_4$ | 11 | $CW_4$ | 101 |

It is evident that extensions of those conversion rules for encoding blocks of two or three 2-bit source words into blocks of two or three 3-bit channel words can be obtained using the teachings given above.

Figure 3:
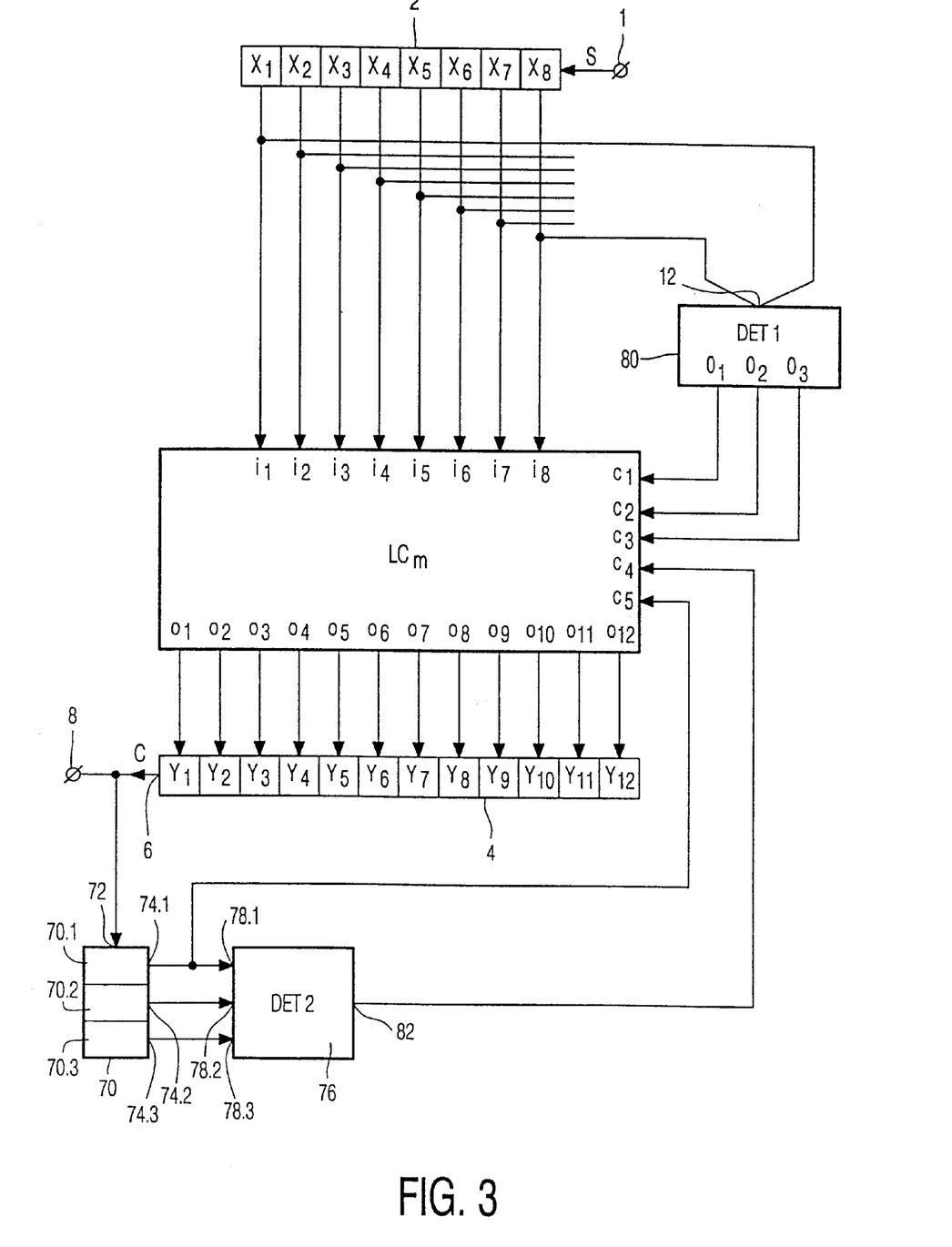
FIG. 3 shows a third embodiment of the encoding device.

FIG. 3 shows a modification of the device of FIG. 1. The device of FIG. 3 is capable of generating a channel signal with a lower k-constraint, more specifically a k-constraint k=7. The modification lies in the addition of the a further shift register 70 having three storage locations 70.1, 70.2 and 70.3, which has an input 72 coupled to the output 6 of the shift register 4, and outputs 74.1, 74.2 and 74.3, being the outputs of the storage locations 70.1, 70.2 and 70.3, respectively. Further, a detector 76 is present having inputs 78.1, 78.2 and 78.3, coupled to the outputs 74.1, 74.2 and 74.3, respectively, of the shift register 70, and having an output 82. The output 74.1 of the shift register 70 is also coupled to a control input $c_5$ of the conversion circuit $LC_m$, and the output 82 of the detector 76 is coupled to a control input $c_4$ of the conversion circuit $LC_m$. Further, the detector 10 in FIG. 1 is slightly modified into the detector 80 in FIG. 3.

As far as the conversion of single 2-bit source words into 3-bit channel words, the conversion of two 2-bit source words into two 3-bit channel words, and the conversion of three 2-bit source words into three 3-bit channel words is concerned, this conversion is the same as explained above with reference to the device of FIG. 1.

The modification lies specifically in the conversion of 8-bit bitsequences of a specific form occurring in the source signal. The detector 80 is, in addition to detecting the 4-bit bitsequences of table II and the 6-bit bitsequences of table III (as explained with reference to the embodiment of FIG. 1), capable of detecting 8-bit bitsequences given in the table VII that follows below. In response to such detection, the detector 80 generates a control signal at its output $o_3$, which control signal is applied to the control input $c_3$ of the logic circuit $LC_m$.

The shift register 70 has the last three bits of the channel signal generated up to now stored in its storage locations 70.1, 70.2 and 70.3, where the storage location 70.1 has the last bit of the channel signal generated up to now stored in it. This last bit of the channel signal, which is either a '0' or a '1' bit, is used as a further control signal for the logic circuit $LC_m$, and is supplied to the logic circuit $LC_m$ via its control input $C_4$. Further, the detector 76 is adapted to generate a control signal at its output 82, when the shift register 70 has the 3-bit bitsequence '010' stored in its storage locations 70.1, 70.2 and 70.3. This control signal is supplied to the logic circuit $LC_m$ via its control input $c_5$.

In accordance with the table VII, the logic circuit $LC_m$ converts the 8-bit bitsequence '00 01 00 01' into its corresponding 12-bit bitsequence '100 010 010 010', in response to the control signal applied to its control input $c_3$, and irrespective of the control signals appearing at its inputs $c_4$ and $c_5$. Further, the logic circuit $LC_m$ converts the 8-bit bitsequence '10 01 00 01' into the 12-bit bitsequence '100 000 010 010', in response to the control signal at its input $c_5$ being equal to '0', and converts the said 8-bit bitsequence into the 12-bit bitsequence '000 010 010 010', in response to the control signal being equal to '1'. When the 8-bit bitsequence '11 10 00 00' appears at the inputs $i_1$ to $i_8$ of the logic circuit, a control signal is generated by the detector 80 at its output $o_3$. Further, when the contents of the shift register 70 equals the 3-bit bitsequence '010', a control signal is generated by the detector 76. In response to both control signals, the logic circuit $LC_m$ converts this 8-bit bitsequence into the 12-bit bitsequence '000 001 010 010', as shown in table VII. When the 8-bit bitsequence '11 10 00 10' appears at the inputs $i_1$ to $i_8$ of the logic circuit, a control signal is generated by the detector 80 at its output $o_3$. Further, when the contents of the shift register 70 equals the 3-bit bitsequence '010', a control signal is generated by the detector 76. In response to both control signals, the logic circuit $LC_m$ converts this 8-bit bitsequence into the 12-bit bitsequence '100 001 010 010', as shown in table VII. When the 8-bit bitsequence '11 10 00 01' appears at the inputs $i_1$ to $i_8$ of the logic circuit, a control signal is generated by the detector 80 at its output $o_3$. Further, when the contents of the shift register 70 equals the 3-bit bitsequence '010', a control signal is generated by the detector 76. In response to both control signals, the logic circuit $LC_m$ converts this 8-bit bitsequence into the 12-bit bitsequence '001 010 010 010', as shown in table VII. When the 8-bit bitsequence '11 10 00 11' appears at the inputs $i_1$ to $i_8$ of the logic circuit, a control signal is generated by the detector 80 at its output $o_3$. Further, when the contents of the shift register 70 equals the 3-bit bitsequence '010', a control signal is generated by the detector 76. In response to both control signals, the logic circuit $LC_m$ converts this 8-bit bitsequence into the 12-bit bitsequence '101 010 010 010', as shown in table VII.

TABLE VII

| 8-bit bitsequence in source signal | | | | last bit(s) in channel signal | 12-bit bitsequence in channel signal | | | |
|---|---|---|---|---|---|---|---|---|
| 00 | 01 | 00 | 01 | don't care | 100 | 010 | 010 | 010 |
| 10 | 01 | 00 | 01 | 0 | 100 | 000 | 010 | 010 |
| 10 | 01 | 00 | 01 | 1 | 000 | 010 | 010 | 010 |
| 11 | 10 | 00 | 00 | 010 | 000 | 001 | 010 | 010 |
| 11 | 10 | 00 | 10 | 010 | 100 | 001 | 010 | 010 |
| 11 | 10 | 00 | 01 | 010 | 001 | 010 | 010 | 010 |
| 11 | 10 | 00 | 11 | 010 | 101 | 010 | 010 | 010 |

With this conversion, the channel signal satisfies k=7 and limits the repeated minimum transition runlength to 6.

Figure 4:
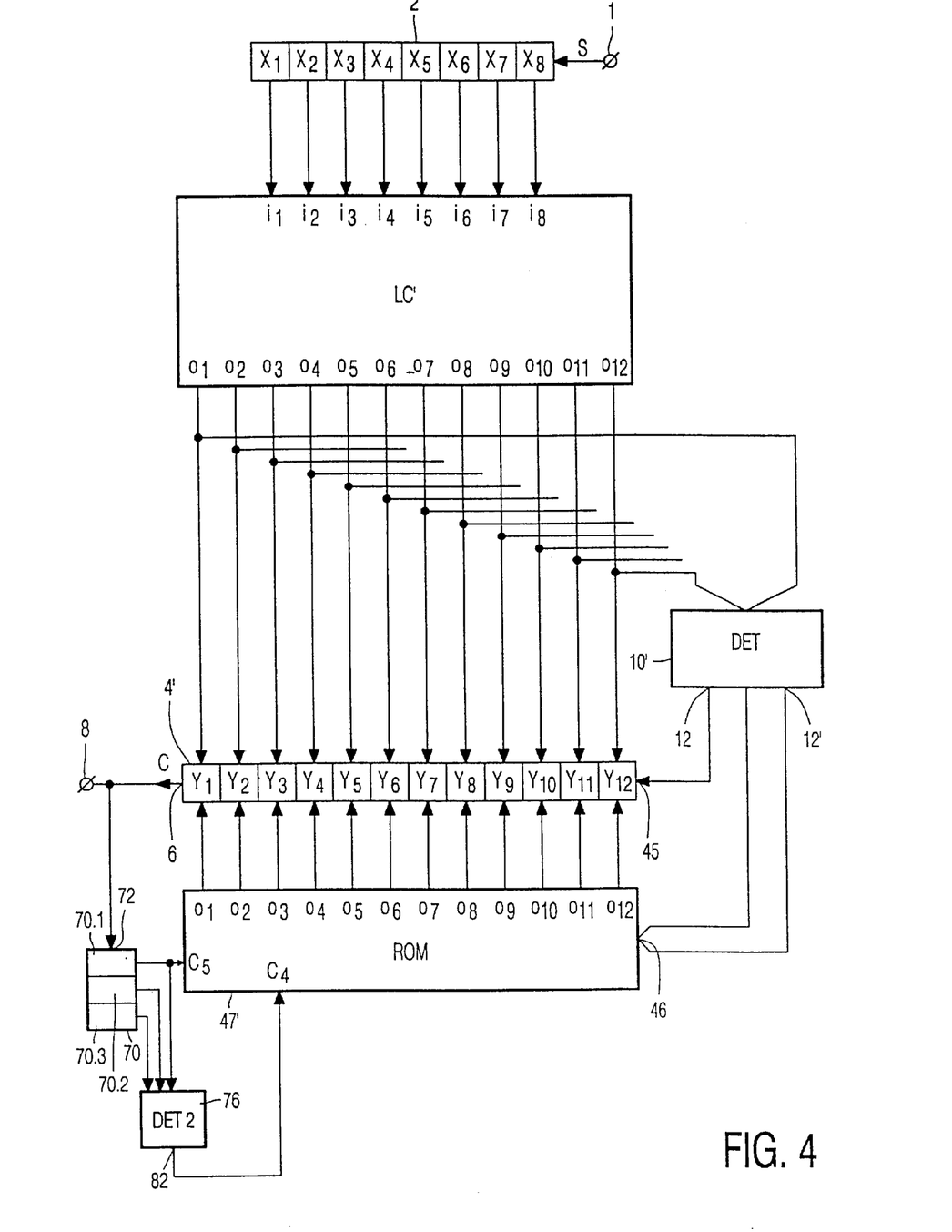
FIG. 4 shows a fourth embodiment of the encoding device.

FIG. 4 shows a modification of the embodiment of FIG. 2, modified so as to enable the conversion in accordance with the table VII above. The embodiment of FIG. 2 is modified into the embodiment of FIG. 4 by adding the shift register 70 and the detector unit 76, which supply their control signals to control inputs $c_4$ and $c_5$ of the ROM 47'. No further description of the embodiment will be given, as with the above description of the embodiment of FIG. 2, with the explanation of the modified encoding of a number of 8-bit bitsequences in the source signal, it is clear for the skilled man to develop an enabling construction for the embodiment of FIG. 4, without employing any inventive activity.

Figure 5:
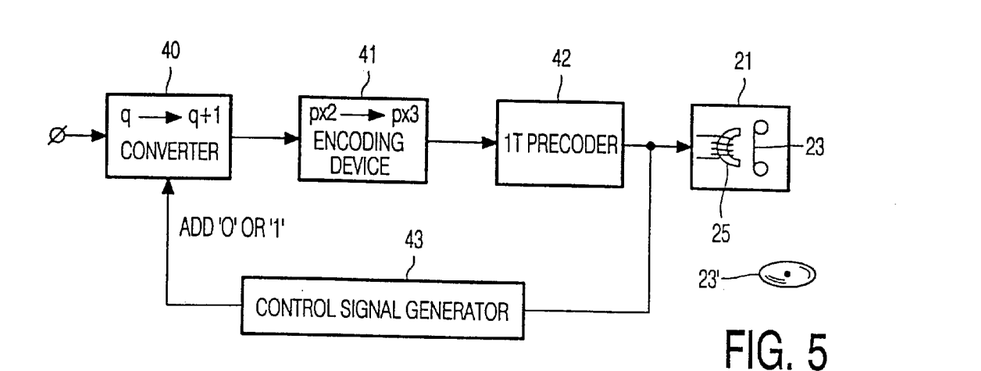
FIG. 5 shows the application of the device in an arrangement for inserting one bit on equidistant positions in the serial source signal.

As has been said previously, the devices described above are very suitable for including in the encoding arrangement where one bit is inserted after each q bits in a serial datastream in order to realize a polarity conversion, or not. Such an encoding arrangement is schematically shown in FIG. 5, where the encoder 40 is followed by the encoding device in accordance with the present invention 41, and a 1T-precoder 42, well known in the art. The output signal of the 1T-precoder 42 is applied to a control signal generator 43, which generates the control signal for the converter 40, so as to control whether a '0' or a '1' is inserted in the serial datastream applied to the converter 40. The encoding device 41 can be inserted between the converter 40 and the 1T-precoder 42 without any modification, as the encoder 41 does not influence the polarity of the signal generated by the converter 40. By means of the arrangement shown in FIG. 5 it is possible to embed a tracking tone of a certain frequency in the serial datastream, or keep the DC content of be datastream to zero. Further, when the encoding device 41 is adapted to generate a (d,k) sequence as explained above, it causes the output signal of the arrangement of FIG. 4 to be a (d,k) RLL output signal. Embodiments of the converter 40 are given in Bell System Technical Journal, Vol 53, No. 6, pp. 1103–1106.

The output signal of the 1T precoder 42 is supplied to a write unit 21 for writing the signal in a track on a record carrier 23. The record carrier 23 can be a magnetic record carrier in longitudinal or disk form. The record carrier could also be an optical record carrier, such as an optical disk 23'. The write unit 21 comprises a write head 25, which is a magnetic write head, when recording the signal on a magnetic record carrier or an optical write head, when recording the signal on an optical record carrier.

Figure 6:
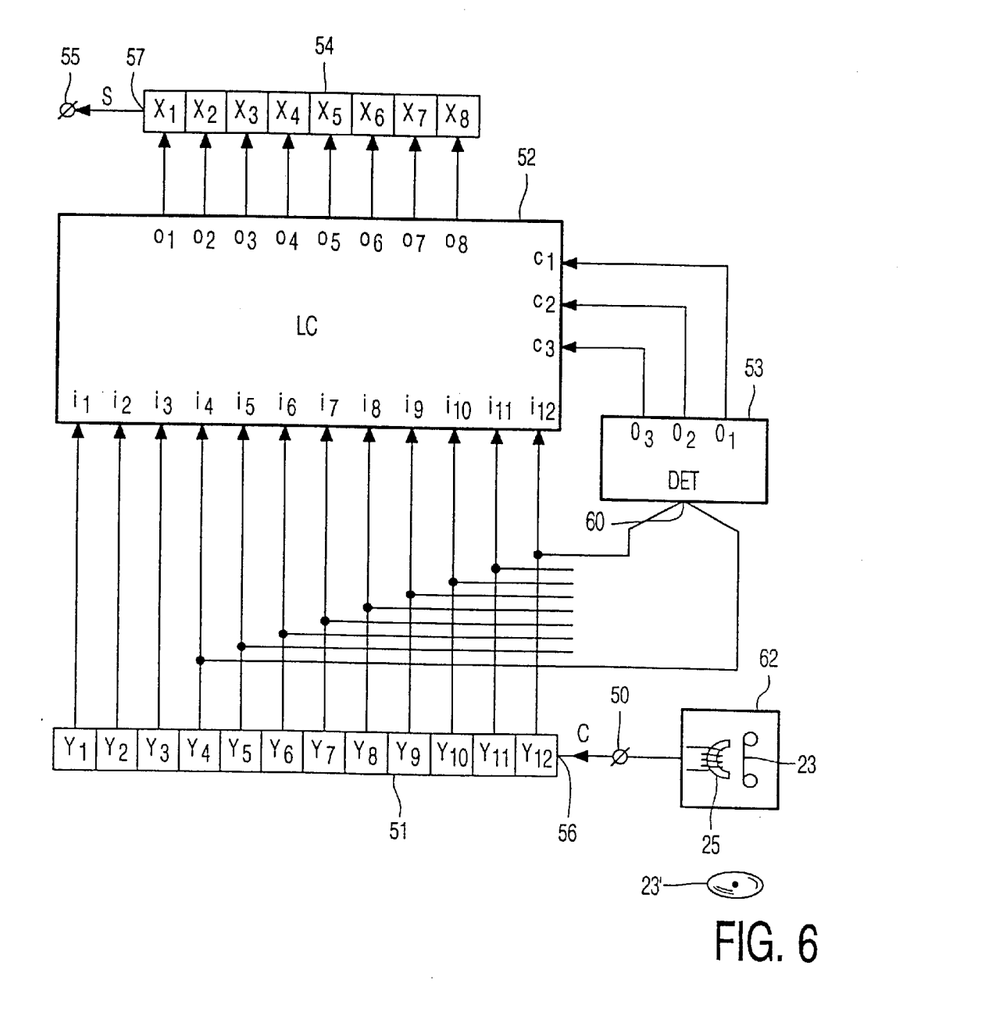
FIG. 6 shows a first embodiment of the decoding device.

FIG. 6 shows an embodiment of a decoding device for decoding the serial datastream obtained by the encoding device of FIG. 1 or 2, so as to obtain a binary source signal. The decoding device has an input terminal 50 for receiving the channel signal, which input terminal 50 is coupled to an input 56 of a shift register 51, comprising twelve cells $Y_1$, to $Y_{12}$. The shift register 51 functions as a serial-parallel converter so that blocks four 3-bit channel words are applied to inputs $i_1$ to $i_{12}$ of a logic circuit 52. The logic circuit 52 comprises the four tables I, II, III and IV. Outputs $o_1$ to $o_8$ of the logic circuit 52 are coupled to inputs of cells $X_1$ to $X_8$ of a shift register 54, which has an output 57 coupled to an output terminal 55. A detector circuit 53 is present having inputs $i_1$ to $i_9$ schematically indicated by the reference number 60, coupled to outputs of cells $Y_4$ to $Y_{12}$ respectively of the shift register 51, and outputs $o_1$, $o_2$ and $o_3$ coupled to control inputs $c_1$, $c_2$ and $c_3$, respectively, of the logic circuit 52. The detector circuit 53 is capable of (a) detecting a '010 010 010' bit pattern in the cells $Y_4$ to $Y_{12}$ of the shift register 51,
(b) detecting a bit pattern '010 010' in the cells $Y_4$ to $Y_9$ of the shift register 51, whilst the bits in the cells $Y_{10}$, $Y_{11}$ and $Y_{12}$ are unequal to '010', and
(c) detecting a '010' bit pattern in the cells $Y_4$, $Y_5$ and $Y_6$, whilst the bits in the bitcells $Y_7$, $Y_8$ and $Y_9$ are unequal to '010'.

Upon detection of the '010 010 010' bitpattern, the detector circuit 53 generates a control signal on its output $o_1$, upon detection of the '010 010' bit pattern in the cells $Y_4$ to $Y_9$, the detector circuit 53 generates a control signal on its output $o_2$, upon detection of the '010' pattern in the cells $Y_4$ to $Y_6$, the detector circuit 53 generates a control signal at its output $0_3$, whilst, when there is no '010' bit pattern in the cells $Y_4$ to $Y_{12}$, it generates no control signal on its outputs.

In the absence of the control signals, the logic circuit 52 converts the 3-bit channel word stored in the cells $Y_1$, $Y_2$ and $Y_3$ into its corresponding 2-bit source word, as per the conversion table I, and supplies the 2-bit source word to the cells $X_1$ and $X_2$. In the presence of the control signal at the input $c_3$, the logic circuit 52 converts the block of two 3-bit channel words stored in the cells $Y_1$ to $Y_6$ into a block of two 2-bit source words, as per the conversion table II, and supplies the two 2-bit source words to the cells $X_1$ to $X_4$. In the presence of the control signal at the input $c_2$, the logic circuit 52 converts the block of three 3-bit channel words stored in the cells $Y_1$ to $Y_9$ into a block of three 2-bit source words, as per the conversion table III, and supplies the three 2-bit source words to the cells $X_1$ to $X_6$. In the presence of the control signal at the input $c_1$, the logic circuit 52 converts the block of four 3-bit channel words stored in the cells $Y_1$ to $Y_{12}$ into a block of four 2-bit source words, as per the conversion table IV, and supplies the four 2-bit source words to the cells $X_1$ to $X_8$.

In this way, the serial datastream of the channel signal is converted into the serial datastream of the source signal.

The encoded information supplied to the input 50 could have been obtained from reproducing the information from a record carrier, such as a magnetic record carrier 23 or an optical record carrier 23'. The device in FIG. 6 thereto comprises a read unit 62 for reading the information from a track on the record carrier, where the unit 62 comprises a read head 64 for reading the information from said track.

Figure 7:
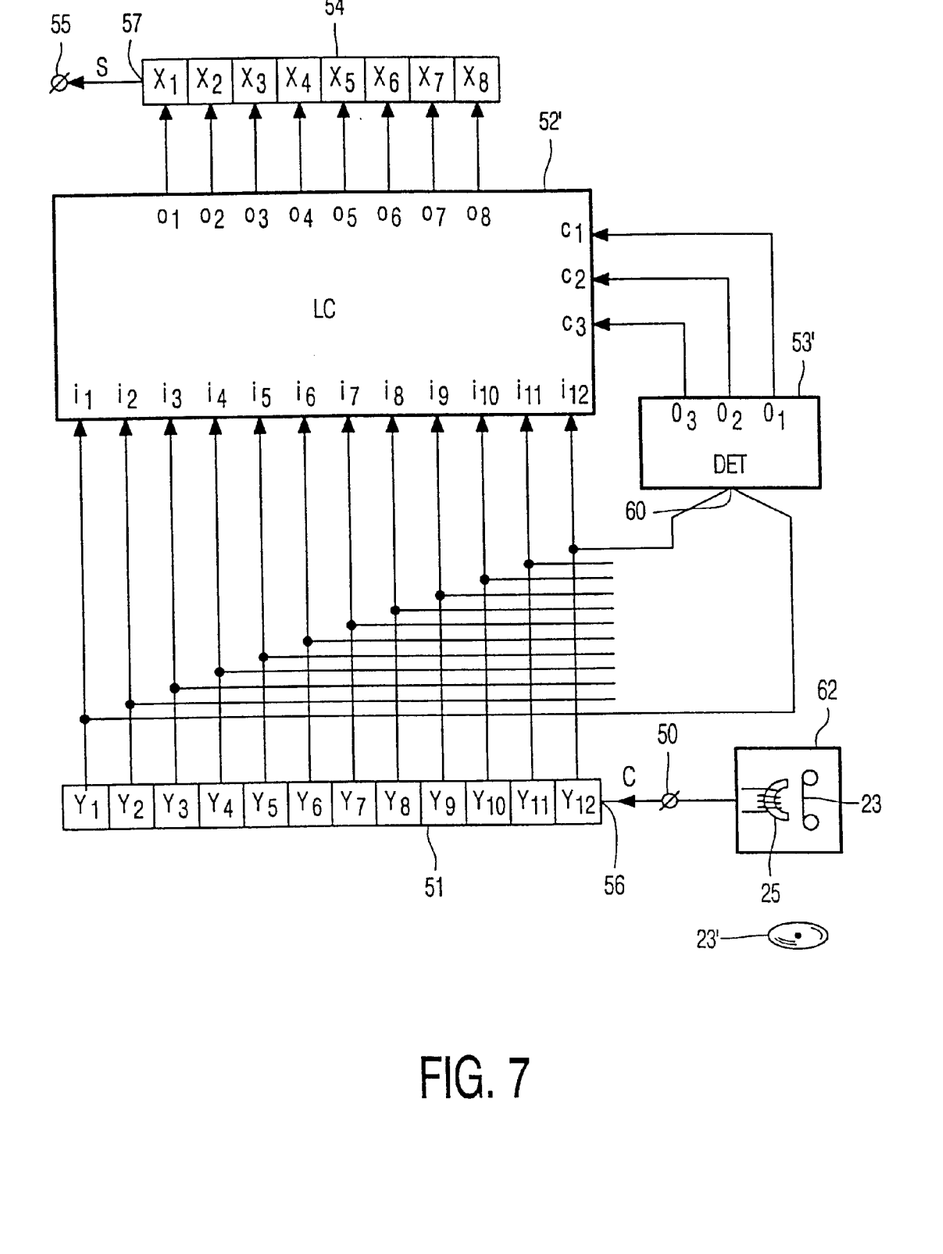
FIG. 7 shows a second embodiment of the decoding device.

FIG. 7 shows an embodiment of the decoder for decoding the channel signal generated by the encoders of the FIGS. 3 or 4. From the table VII, it is clear that the specific 12-bit bitsequences in the channel signal that should be decoded in accordance with the table VII cannot all be detected by the sequence '010 010 010'. Therefore, the detector 53' requires inputting of the 12-bit bitsequence in order to identify all the seven 12-bit bitsequences included in the table VII.

Whilst the invention has been described with reference to preferred embodiments thereof, it is to be understood that these are not limitative examples. Thus, various modifications may become apparent to those skilled in the art, without departing from the scope of the invention, as defined in the claims. As an example, the decoding device of FIG. 6 could be modified into a device in which the detector 53 detects the various modified decoding situations from the decoded information, instead of from the encoded information, as disclosed in FIG. 6.

Further, the invention lies in each and every novel feature or combination of features.

What is claimed is:

1. An encoder for encoding a stream of n-bit source words of a binary source signal into a stream m-bit channel words of a binary channel signal, said encoder comprising:

converting means for converting each successive block of p consecutive n-bit source words into a corresponding block of p consecutive m-bit channel words, the conversion of each block being substantially parity preserving, where n, m and p are integers, m>n≧1, and p>1 and is variable; and detecting means coupled to said converting means for detecting the presence in the bitstream of the binary source signal of the 8-bit sequence "10010001", and in that event controlling said converting means to convert said 8-bit sequence into the 12-bit sequence "100010010010" in the binary channel signal.

* * * * *